United States Patent
Dong et al.

(10) Patent No.: US 10,325,925 B2
(45) Date of Patent: Jun. 18, 2019

(54) DISPLAY SUBSTRATE, METHOD FOR PRODUCING THE SAME, AND DISPLAY APPARATUS

(71) Applicants: BOE Technology Group Co., Ltd., Beijing (CN); Beijing BOE Optoelectronics Technology Co., Ltd., Beijing (CN)

(72) Inventors: Yiping Dong, Beijing (CN); Lei Zhang, Beijing (CN); Haibo Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 8 days.

(21) Appl. No.: 15/647,734

(22) Filed: Jul. 12, 2017

(65) Prior Publication Data

US 2018/0026051 A1 Jan. 25, 2018

(30) Foreign Application Priority Data

Jul. 20, 2016 (CN) .......................... 2016 1 0571821

(51) Int. Cl.
*H01L 27/12* (2006.01)
*H01L 27/32* (2006.01)
(Continued)

(52) U.S. Cl.
CPC .............. *H01L 27/12* (2013.01); *G06F 3/041* (2013.01); *G06F 3/0412* (2013.01);
(Continued)

(58) Field of Classification Search
CPC ..................................................... H01L 27/12
(Continued)

(56) References Cited

U.S. PATENT DOCUMENTS

| 6,636,279 B2 | 10/2003 | Takasugi et al. |
| 7,064,351 B2 | 6/2006 | Kawamura |

(Continued)

FOREIGN PATENT DOCUMENTS

| CN | 1334550 A | 2/2002 |
| CN | 1584686 A | 2/2005 |

OTHER PUBLICATIONS

First Office Action, including Search Report, for Chinese Patent Application No. 201610571821.X, dated Dec. 26, 2018, 10 pages.

*Primary Examiner* — Jefferey F Harold
*Assistant Examiner* — Justin B Sanders
(74) *Attorney, Agent, or Firm* — Westman, Champlin & Koehler, P.A.

(57) ABSTRACT

Embodiments of this invention relate to a display substrate and a method for producing the same, as well as a display apparatus. The display substrate comprises a display area and a non-display area surrounding the display area, wherein the non-display area comprises: a first signal line, an insulating layer, and a second signal line, which are located above a base substrate, wherein projections of the first signal line and the second signal line on the base substrate are intersected with each other, and the insulating layer allows the first signal line and the second signal line to be insulated from each other; a dummy electrode in the same layer as the second signal line, and a semiconductor pad provided between the dummy electrode and the insulating layer, wherein the projection of the dummy electrode on the base substrate and the projection of the first signal line on the base substrate are intersected with each other with an intersection being located within the projection of the semiconductor pad on the base substrate.

12 Claims, 2 Drawing Sheets

(51) Int. Cl.
    *G06F 3/041*      (2006.01)
    *H01L 27/11585*   (2017.01)
    *G06F 3/044*      (2006.01)

(52) U.S. Cl.
    CPC .......... *H01L 27/3223* (2013.01); *G06F 3/044* (2013.01); *G06F 2203/04103* (2013.01); *H01L 27/11585* (2013.01); *H01L 27/3258* (2013.01)

(58) Field of Classification Search
    USPC ........................................................ 348/450
    See application file for complete search history.

(56) References Cited

U.S. PATENT DOCUMENTS

2008/0024415 A1\* 1/2008 Jung .................. G02F 1/13454
                                                    345/92
2013/0155356 A1\* 6/2013 Jang ..................... G02F 1/1343
                                                    349/106

\* cited by examiner

DISPLAY SUBSTRATE, METHOD FOR PRODUCING THE SAME, AND DISPLAY APPARATUS

CROSS-REFERENCE TO RELATED APPLICATIONS

This application is a non-provisional application of Chinese Patent Application No. 201610571821.X, filed on Jul. 20, 2016, with the State Intellectual Property Office, the content of which is hereby incorporated in its entirety.

TECHNICAL FIELD

Embodiments of this invention generally relate to the technical field of display, and particularly to a display substrate and a method for producing the same, as well as a display apparatus.

BACKGROUND ART

In the design process of a current display substrate, in a non-display area surrounding a display area of the display substrate, a first signal line and a second signal line, which are located in different layers and formed from conductive materials, may be crossed with each other. In order to maintain the first signal line to be insulated from the second signal line, an insulating layer is provided between the first signal line and the second signal line. However, in the process of manufacture, transportation, or use of the display substrate, electrostatic charges may generate on the first signal line or the second signal line. The accumulation of electrostatic charges may lead to breakdown conduction of the insulating layer between the first signal line and the second signal line, resulting in product badness.

SUMMARY

According to one embodiment of this invention, there is provided a display substrate, comprising a display area and a non-display area surrounding the display area, wherein the non-display area comprises:

a first signal line, an insulating layer, and a second signal line, which are located above a base substrate, wherein projections of the first signal line and the second signal line on the base substrate are intersected with each other, and the insulating layer allows the first signal line and the second signal line to be insulated from each other, a dummy electrode in the same layer as the second signal line, and a semiconductor pad provided between the dummy electrode and the insulating layer, wherein the projection of the dummy electrode on the base substrate and the projection of the first signal line on the base substrate are intersected with each other with an intersection being located within the projection of the semiconductor pad on the base substrate.

In one embodiment, the semiconductor pad is formed from at least one material of silicon, germanium, a silicon-germanium alloy, a silicon-carbon alloy, a silicon-germanium-carbon alloy, a carbon-based semiconductor, a Group II-VI compound semiconductor material, a Group III-V compound semiconductor material, an oxide semiconductor material, and an organic semiconductor material. More preferably, the semiconductor pad is formed from at least one material of amorphous silicon, polycrystalline silicon, and monocrystalline silicon.

In one embodiment, the first signal line and a gate line are provided in the same layer and employ the same material, and the dummy electrode and source/drain electrodes are provided in the same layer and employ the same material.

In one embodiment, the first signal line and source/drain electrodes are provided in the same layer and employ the same material, and the dummy electrode and a gate line are provided in the same layer and employ the same material.

In one embodiment, the non-display area comprises at least two second signal lines provided in parallel, and the dummy electrode and the semiconductor pad are provided between two adjacent second signal lines provided in parallel.

According to one embodiment of this invention, there is provided a display apparatus comprising the display substrate described above.

According to one embodiment of this invention, there is provided a method for producing the display substrate comprising a display area and a non-display area surrounding the display area described above, comprising:

forming a pattern of the first signal line on the base substrate in the non-display area by a patterning process;

forming the insulating layer above the first signal line;

forming a pattern of the semiconductor pad above the insulating layer by a patterning process, wherein the projection of the first signal line on the base substrate and the projection of the semiconductor pad on the base substrate are intersected with each other;

forming a pattern of the second signal line above the insulating layer by a patterning process, wherein projections of the first signal line and the second signal line on the base substrate are intersected with each other;

forming a pattern of the dummy electrode above the insulating layer and the semiconductor pad by a patterning process, wherein the projection of the dummy electrode on the base substrate and the projection of the first signal line on the base substrate are intersected with each other with an intersection being located within the projection of the semiconductor pad on the base substrate.

In one embodiment, the first signal line and a gate line are produced in the same layer, and the dummy electrode and source/drain electrodes are produced in the same layer.

In one embodiment, the first signal line and source/drain electrodes are produced in the same layer, and the dummy electrode and a gate line are produced in the same layer.

In one embodiment, the pattern of the second signal line and the pattern of the dummy electrode are formed by an identical patterning process.

Embodiments of this invention provide a novel display substrate and a method for producing the same, as well as a display apparatus. It is possible to effectively discharge static electricity and it is possible to maintain the insulation between the first signal line and the second signal line while the design space is saved, so as to prevent failures caused by electrostatic breakdown.

DESCRIPTION OF DRAWINGS

In order to illustrate the technical solutions in examples of this invention more clearly, figures required for describing the examples will be simply introduced below. It is apparent that the figures described below are some examples of this invention, and other figures may be further obtained by ordinary skilled person in the art according to these figures without exerting inventive work.

DESCRIPTION OF EMBODIMENTS

In order to enable the objects, technical solutions, and the advantages of the examples of this invention to be clearer, the technical solutions in the examples of this invention will be described clearly and fully below in conjunction with accompanying drawings in the examples of this invention. Obviously, the examples described are a part of the examples of this invention, rather than all of the examples. Based on the examples in this invention, all other examples obtained by those of ordinary skill in the art without performing inventive work belong to the scope protected by this invention.

Figure 1:
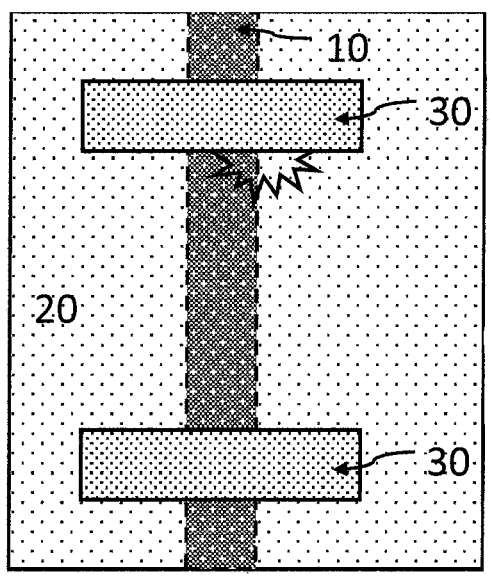
FIG. 1 schematically shows a partial top view of a non-display area of a display substrate.

In a non-display area of a display substrate, when excessive electrostatic charges accumulate on a first signal line and a second signal line, electrostatic discharge will occur at the crossing of the first signal line and the second signal line which are crossed with each other, so that an insulating layer between the first signal line and the second signal line is broken down, leading to conduction between the first signal line and the second signal line, which should be insulated, and resulting in the occurrence of failures. As shown in FIG. 1, it can be seen from the partial top view of the non-display area of the display substrate that accumulation of static electricity will occur at the position where the first signal line 10 and the second signal line 30 are overlapped so as to break down the insulating layer 20 between the first signal line 10 and the second signal line 30, leading to conduction between the first signal line 10 and the second signal line 30 and resulting in failures such as X-line badness, and/or Y-line badness, etc., which occur in a display apparatus comprising this display substrate.

According to a first aspect of examples of this invention, there is provided a display substrate, comprising a display area and a non-display area surrounding the display area, wherein the non-display area comprises:

a first signal line, an insulating layer, and a second signal line, which are located above a base substrate, wherein projections of the first signal line and the second signal line on the base substrate are intersected with each other, and the insulating layer allows the first signal line and the second signal line to be insulated from each other, a dummy electrode in the same layer as the second signal line, and a semiconductor pad provided between the dummy electrode and the insulating layer, wherein the projection of the dummy electrode on the base substrate and the projection of the first signal line on the base substrate are intersected with each other with an intersection being located within the projection of the semiconductor pad on the base substrate.

As a typical embodiment, the non-display area comprises at least two second signal lines provided in parallel, and the dummy electrode and the semiconductor pad are provided between two adjacent second signal lines provided in parallel. In this case, a dummy electrode, which is provided in the same layer as and in parallel with the second signal lines, is included between two adjacent second signal lines provided in parallel; a semiconductor pad is provided between the dummy electrode and the insulating layer; and the projection of the dummy electrode on the base substrate is located within the projection of the semiconductor pad on the base substrate. Compared to a structure in which there is only an insulating layer between the second signal lines at opposite sides of the dummy electrode and the first signal line, a structure in which a semiconductor pad besides the insulating layer is further added between the dummy electrode and the first signal line will attract electrostatic charges more easily, to allow the occurrence of electrostatic breakdown at the position of the insulating layer where the dummy electrode and the semiconductor pad are located, so as to connect the dummy electrode to the first signal line. Since the stack of the dummy electrode and the semiconductor pad is provided in parallel with the second signal lines at the both sides thereof, even if the insulating layer between the first signal line and the stack of the dummy electrode and the semiconductor pad is broken down, the insulation between the second signal lines at the both sides thereof and the first signal line will not be influenced. Therefore, it is possible to effectively discharge static electricity without using an electrostatic ring, and thus the insulation between the first signal line and the second signal line is maintained while the design space is saved, so as to prevent failures caused by electrostatic breakdown of the insulating layer between the first signal line and the second signal line.

According to an exemplary example of this invention, the semiconductor pad is formed from at least one material of silicon, germanium, a silicon-germanium alloy, a silicon-carbon alloy, a silicon-germanium-carbon alloy, a carbon-based semiconductor, a Group II-VI compound semiconductor material, a Group III-V compound semiconductor material, an oxide semiconductor material, and an organic semiconductor material. According to this example, these semiconductor materials have good semiconductivities and are prone to attract electrostatic charges so as to inhibit charge accumulation on the insulating layer between the second signal line at the both sides thereof and the first signal line and to protect the second signal line.

According to an exemplary example of this invention, the semiconductor pad is formed from at least one material of amorphous silicon, polycrystalline silicon, and monocrystalline silicon. According to this example, as constituent materials for semiconductor pads, amorphous silicon, polycrystalline silicon, and monocrystalline silicon reduce the cost of display substrates due to easy production, and can further improve the ability of discharging static electricity of the display substrate due to good characteristics of attracting electrostatic charges.

According to an exemplary example of this invention, the first signal line and a gate line are provided in the same layer and employ the same material, and the dummy electrode and source/drain electrodes are provided in the same layer and employ the same material. According to this exemplary example, it is possible to form the first signal line together with the gate line and to form the dummy electrode together with the source/drain electrodes conveniently and flexibly, and mask plates separately designed for the first signal line and the dummy electrode and additional production processes are not needed, so that the cost of the display substrate may be reduced.

According to another exemplary example of this invention, the first signal line and source/drain electrodes are provided in the same layer and employ the same material, and the dummy electrode and a gate line are provided in the same layer and employ the same material. According to this exemplary example, it is possible to form the first signal line together with the source/drain electrodes and to form the dummy electrode together with the gate line conveniently and flexibly, and mask plates separately designed for the first signal line and the dummy electrode and additional production processes are not needed, so that the cost of the display substrate may be reduced.

According to an exemplary example of this invention, the dummy electrode and the semiconductor pad are located on at least one side of the non-display area. According to this exemplary example, it is possible to provide electrostatic discharge protection on at least one side of the non-display area and to save space.

According to a second aspect of examples of this invention, there is provided a display apparatus, comprising the display substrate according to the first aspect described above.

According to this aspect, since the display substrate described above has an electrostatic discharge unit, the display apparatus comprising the display substrate described above may be allowed to effectively discharge static electricity without using an electrostatic ring, and thus the insulation between the first signal line and the second signal line is maintained while the design space is saved, so as to prevent failures caused by electrostatic breakdown of the insulating layer between the first signal line and the second signal line.

According to a third aspect of examples of this invention, there is provided a production method of a display substrate comprising a display area and a non-display area surrounding the display area, comprising:

forming a pattern of a first signal line on a base substrate in the non-display area by a patterning process;

forming an insulating layer above the first signal line;

forming a pattern of a semiconductor pad above the insulating layer by a patterning process, wherein the projection of the first signal line on the base substrate and the projection of the semiconductor pad on the base substrate are intersected with each other;

forming a pattern of a second signal line above the insulating layer by a patterning process, wherein projections of the first signal line and the second signal line on the base substrate are intersected with each other;

forming a pattern of a dummy electrode above the insulating layer and the semiconductor pad by a patterning process, wherein the projection of the dummy electrode on the base substrate and the projection of the first signal line on the base substrate are intersected with each other with an intersection being located within the projection of the semiconductor pad on the base substrate.

In a typical embodiment, a pattern of a first signal line is formed on a base substrate in the non-display area by a patterning process;

an insulating layer is formed above the first signal line;

patterns of a plurality of parallel second signal lines and a pattern of a dummy electrode which is located between two adjacent parallel second signal lines and is in parallel with the second signal lines are formed above the insulating layer by a patterning process, wherein projections of the first signal line and the second signal line on the base substrate are intersected with each other.

Here, the production method further comprises, after forming the insulating layer and before forming the pattern of the second signal lines and the pattern of the dummy electrode: forming a pattern of a semiconductor pad in an area corresponding to the dummy electrode above the insulating layer by a patterning process, wherein the projection of the dummy electrode on the base substrate is located within the projection of the semiconductor pad on the base substrate.

Thus, between two adjacent second signal lines provided in parallel, a dummy electrode, which is in the same layer as and in parallel with the second signal lines, is formed; a semiconductor pad is formed between the dummy electrode and the insulating layer; and the projection of the dummy electrode on the base substrate is located within the projection of the semiconductor pad on the base substrate. The presence of a semiconductor pad besides the insulating layer between the dummy electrode and the first signal line enables electrostatic charges to be attracted more easily, to allow the occurrence of electrostatic breakdown at the position of the insulating layer where the dummy electrode and the semiconductor pad are located, so as to connect the dummy electrode to the first signal line. Since the stack of the dummy electrode and the semiconductor pad is provided in parallel with the second signal lines at the both sides thereof, even if the insulating layer between the first signal line and the stack of the dummy electrode and the semiconductor pad is broken down, the insulation between the second signal lines at the both sides thereof and the first signal line will not be influenced. Therefore, a display substrate having an electrostatic discharge unit may be produced. This display substrate effectively discharges static electricity without using an electrostatic ring, and thus the insulation between the first signal line and the second signal line is maintained while the design space is saved, so as to prevent failures caused by electrostatic breakdown of the insulating layer between the first signal line and the second signal line.

According to an exemplary example of this invention, the first signal line and a gate line are produced in the same layer, and the dummy electrode and source/drain electrodes are produced in the same layer. According to this example, the production process of the display substrate is convenient and flexible and is simplified, so that the production cost of the display substrate may be reduced.

According to another exemplary example of this invention, the first signal line and source/drain electrodes are produced in the same layer, and the dummy electrode and a gate line are produced in the same layer. According to this example, the production process of the display substrate is convenient and flexible and is simplified, so that the production cost of the display substrate may be reduced.

According to another exemplary example of this invention, the pattern of the second signal line and the pattern of the dummy electrode are formed by an identical patterning process. According to this example, the production process of the display substrate is convenient and flexible and is simplified, so that the production cost of the display substrate may be reduced.

It can be known from the technical solutions described above that the display substrate and the display apparatus achieved in examples of this invention can effectively discharge static electricity and maintain the insulation between the first signal line and the second signal line while the design space is saved, so as to prevent failures caused by electrostatic breakdown.

Figure 2:
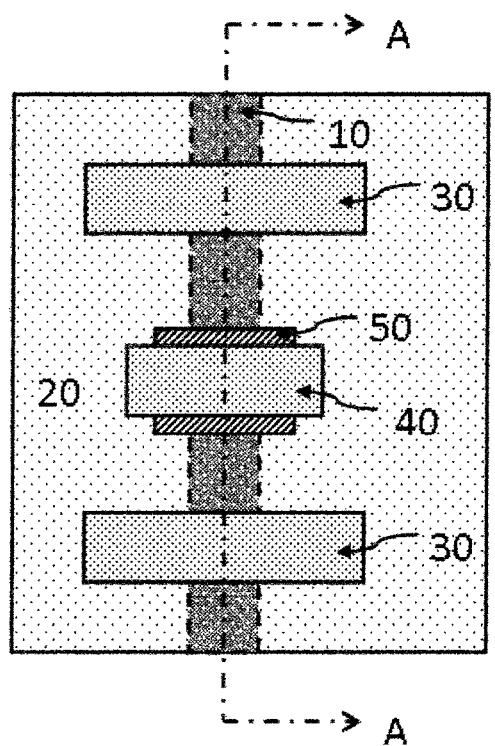
FIG. 2 schematically shows a partial top view of a non-display area of a display substrate according to an exemplary example of this invention.
Figure 3:
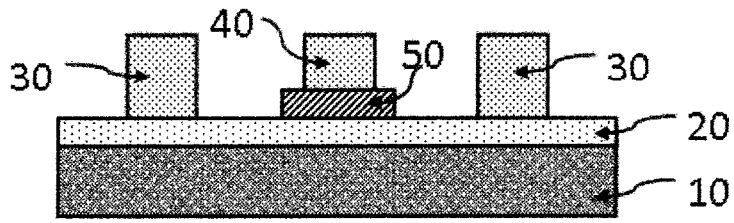
FIG. 3 schematically shows a sectional view of the non-display area of the display substrate shown in FIG. 2 taken along line A-A.

According to an exemplary example of this invention, there is provided a display substrate. The display substrate comprises a display area and a non-display area surrounding the display area. FIG. 2 schematically shows a partial top view of a non-display area of a display substrate according to an exemplary example, and FIG. 3 schematically shows a sectional view of the non-display area of the display substrate shown in FIG. 2 taken along line A-A. As shown in FIGS. 2 and 3, this non-display area comprises a first signal line 10, an insulating layer 20, and a second signal line 30, which are located above a base substrate. The second signal line may be a plurality of second signal lines provided in parallel, and two second signal lines are shown in the figure. Projections of the first signal line 10 and the second signal line 30 on the base substrate are intersected with each other, and the insulating layer 20 allows the first signal line 10 and the second signal line 30 to be insulated from each other. In FIG. 2, the second signal line 30 is shown with solid-line borders and the first signal line 10 is shown with dashed-line borders to demonstrate that the second signal line 30 and the first signal line 10 are located on opposite sides of the insulating layer 20 respectively and are insulated from each other by the insulating layer 20.

As shown in FIGS. 2 and 3, a dummy electrode 40, which is provided in the same layer as and in parallel with the second signal line 30, is included between two adjacent second signal lines 30 provided in parallel, and a semiconductor pad 50 is provided between the dummy electrode 40 and the insulating layer 20. Furthermore, the projection of the dummy electrode on the base substrate and the projection of the first signal line on the base substrate are intersected with each other with an intersection being located within the projection of the semiconductor pad on the base substrate.

On the base substrate, between two adjacent second signal lines 30 provided in parallel, the dummy electrode 40 is provided in the same layer as and in parallel with the second signal lines; the semiconductor pad 50 is provided between the dummy electrode 40 and the insulating layer 20; and the projection of the dummy electrode 40 on the base substrate is located within the projection of the semiconductor pad 50 on the base substrate, so that electrostatic charges in the display substrate may be attracted to the area where the dummy electrode 40 and the semiconductor pad 50 are located and therefore the first signal line and the second signal line are protected. When electrostatic charges accumulate to a certain extent, the insulating layer at this position is subjected to electrostatic breakdown, so that the dummy electrode 40 and the first signal line 10 are connected. Since the stack of the dummy electrode 40 and the semiconductor pad 50 is provided in parallel with the second signal lines 30 on the both sides thereof, even if the insulating layer between the first signal line 10 and the stack of the dummy electrode 40 and the semiconductor pad 50 is broken down, the insulation between the second signal lines 30 on the both sides thereof and the first signal line 10 will not be influenced. Therefore, it is possible to effectively discharge static electricity without using an electrostatic ring, and thus the insulation between the first signal line and the second signal line is maintained while the design space is saved, so as to prevent failures of the display substrate and the display apparatus comprising the display substrate caused by electrostatic breakdown of the insulating layer between the first signal line and the second signal line.

In FIG. 2, projections of the first signal line 10 and the second signal line 30 on the base substrate are substantially perpendicular. However, it can be understood that this disclosure is not limited thereto, as long as there is an overlapped area between the first signal line 10 and the second signal line 30. That is, projections of the first signal line 10 and the second signal line 30 on the base substrate are intersected with each other, and the angle formed between the projections of the first signal line 10 and the second signal line 30 on the base substrate is arbitrary.

In FIG. 2, the dummy electrode 40 and the semiconductor pad 50 are provided in substantially parallel with the second signal line 30. However, it can be understood that this disclosure is not limited thereto. The dummy electrode 40 and semiconductor pad 50 may form any angle with the second signal line 30, as long as the stack of the dummy electrode 40 and the semiconductor pad 50 is separated from the second signal line 30 so as to allow electrostatic breakdown caused by the accumulation of electrostatic charges attracted by the semiconductor pad 50 to occur only in the area where the dummy electrode 40 and the semiconductor pad 50 are located. In FIGS. 2 and 3, the first signal line 10 is located below the insulating layer 20 and the second signal line 30 and the stack of the dummy electrode 40 and the semiconductor pad 50 are located above the insulating layer 20. However, it can be understood that this disclosure is not limited thereto. Also within the scope of this disclosure is the case that the first signal line 10 is located above the insulating layer 20 and the second signal line 30 and the stack of the dummy electrode 40 and the semiconductor pad 50 are located below the insulating layer 20.

In FIGS. 2 and 3, the width of the semiconductor pad 50 is exemplified to be greater than the width of the dummy electrode 40. However, it can be understood that the width of the semiconductor pad 50 may be greater than or equal to the width of the dummy electrode 40, as long as the projection of the dummy electrode 40 on the base substrate is located in the projection of the semiconductor pad 50 on the base substrate.

The material of the insulating layer 20 is not particularly limited, as long as it can have the function of insulating the first signal line 10 from the second signal line 30.

The materials of the first signal line 10, the second signal line 30, and the dummy electrode 40 are not particularly limited, as long as they are capable of conducting electricity. For example, the first signal line 10, the second signal line 30, and the dummy electrode 40 may be formed from metals or metal alloys.

In an exemplary example, the semiconductor pad 50 may be formed from at least one material of silicon, germanium, a silicon-germanium alloy, a silicon-carbon alloy, a silicon-germanium-carbon alloy, a carbon-based semiconductor such as a carbon nanotube, a carbon nanowire, graphene, etc., a Group II-VI compound semiconductor material, a Group III-V compound semiconductor material, an oxide semiconductor material such as $Cu_2O$, $ZnO$, $SnO_2$, $Fe_2O_3$, $Cr_2O_3$, $TiO_2$, $ZrO_2$, $CoO$, $WO_3$, $In_2O_3$, $Al_2O_3$, $Fe_3O_4$, etc., and an organic semiconductor material.

The crystalline form of the material of the semiconductor pad 50 is not particularly limited, and may be an amorphous, polycrystalline, or monocrystalline form. For example, the semiconductor pad 50 may formed from at least one material of amorphous silicon, polycrystalline silicon, and monocrystalline silicon.

The doping type of the material of the semiconductor pad 50 is not particularly limited. The semiconductor pad 50 may be n-type, p-type, or undoped.

In an exemplary example, the first signal line 10 and a gate line are provided in the same layer and employ the same material, and the dummy electrode 40 and source/drain electrodes are provided in the same layer and employ the same material. In another exemplary example, the first signal line 10 and source/drain electrodes are provided in the same layer and employ the same material, and the dummy electrode 40 and a gate line are provided in the same layer and employ the same material. Therefore, mask plates separately designed for the first signal line 10 and the dummy electrode 40 and additional production processes are not needed. However, this disclosure is not limited thereto. Each of the first signal line 10 and the dummy electrode 40 may also be separately produced.

In an exemplary example, the dummy electrode 40 and the semiconductor pad 50 may be located on at least one side of the non-display area, so that it is possible to provide electrostatic protection on at least one side of the non-display area. The at least one side of the non-display area may include one or more non-IC sides, one or more IC sides, or any combination of IC sides and non-IC sides, or even the entire non-display area.

An example of this invention further provides a display apparatus comprising the display substrate described above.

Furthermore, an example of this invention further provides a production method of a display substrate comprising a display area and a non-display area surrounding the display area.

Figure 4:
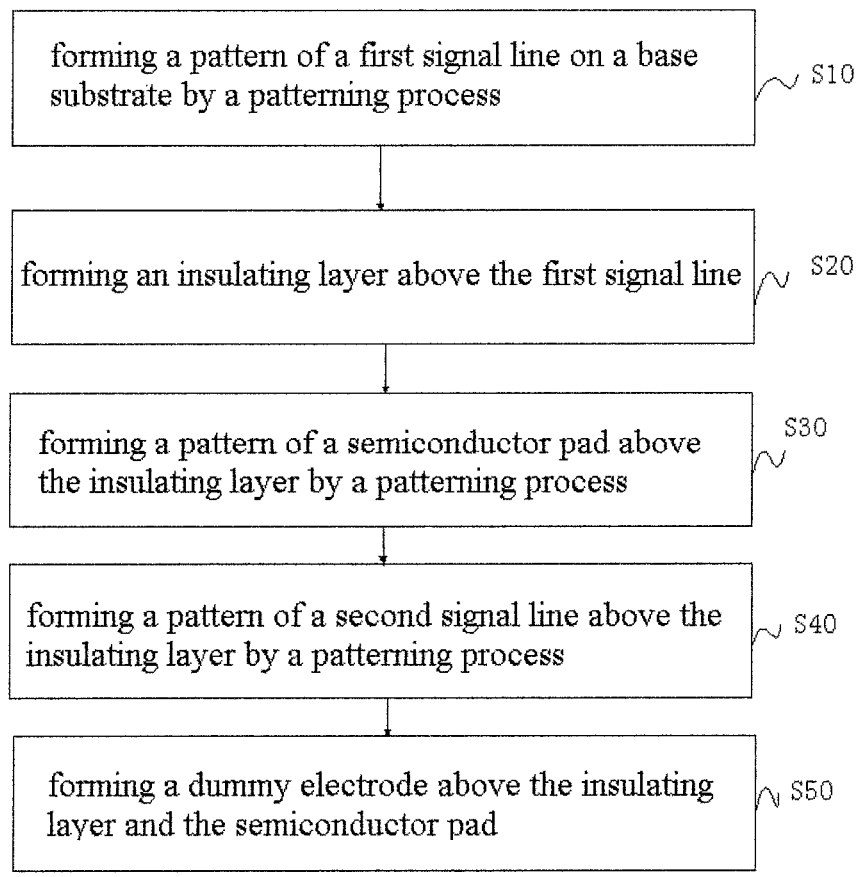
FIG. 4 is a flow chart showing a method for producing a display substrate according to an exemplary embodiment of this invention.

As shown in FIG. 4 and with reference to FIGS. 2 and 3, the production method of the display substrate comprises:

forming a pattern of a first signal line 10 on a base substrate in the non-display area by a patterning process (step S10);

forming an insulating layer 20 above the first signal line 10 (step S20);

forming a pattern of a semiconductor pad 50 above the insulating layer 20 by a patterning process, wherein the projection of the first signal line 10 on the base substrate the projection of the semiconductor pad 50 on the base substrate are intersected with each other (step S30);

forming a pattern of a second signal line 30 above the insulating layer 20 by a patterning process, projections of the first signal line 10 and the second signal line 30 on the base substrate are intersected with each other (step S40);

forming a pattern of a dummy electrode 40 above the insulating layer 20 and the semiconductor pad 50 by a patterning process, wherein the projection of the dummy electrode 40 on the base substrate and the projection of the first signal line 10 on the base substrate are intersected with each other with an intersection being located within the projection of the semiconductor pad 50 on the base substrate (step S50).

Preferably, the steps S40 and S50 may be incorporated together.

In this production method, the semiconductor pad 50 may be formed by using at least one material of silicon, germanium, a silicon-germanium alloy, a silicon-carbon alloy, a silicon-germanium-carbon alloy, a carbon-based semiconductor such as a carbon nanotube, a carbon nanowire, graphene, etc., a Group II-VI compound semiconductor material, a Group III-V compound semiconductor material, an oxide semiconductor material such as $Cu_2O$, $ZnO$, $SnO_2$, $Fe_2O_3$, $Cr_2O_3$, $TiO_2$, $ZrO_2$, $CoO$, $WO_3$, $In_2O_3$, $Al_2O_3$, $Fe_3O_4$, etc., and an organic semiconductor material. For example, the semiconductor pad 50 may formed from at least one material of amorphous silicon, polycrystalline silicon, and monocrystalline silicon.

In an exemplary example, the first signal line 10 and a gate line are produced in the same layer, and the dummy electrode 40 and source/drain electrodes are produced in the same layer. In another exemplary example, the first signal line 10 and source/drain electrodes are produced in the same layer, and the dummy electrode 40 and a gate line are produced in the same layer. Therefore, mask plates separately designed for the first signal line 10 and the dummy electrode 40 and additional production processes are not needed. However, this disclosure is not limited thereto. Each of the first signal line 10 and the dummy electrode 40 may also be separately produced.

In an exemplary example, the dummy electrode 40 and the semiconductor pad 50 may be formed on at least one side of the non-display area, so that it is possible to provide an electrostatic protection structure on the at least one side of the non-display area. For example, the dummy electrode 40 and the semiconductor pad 50 may be provided on one or more non-IC sides, one or more IC sides, or any combination of IC sides and non-IC sides of the non-display area, or even in the entire non-display area.

As described above, the display substrate and the display apparatus achieved in examples of this invention can effectively discharge static electricity without using an electrostatic ring, and the insulation between the first signal line and the second signal line may be maintained while the design space is saved, so as to prevent failures caused by electrostatic breakdown.

Those described above are merely exemplary embodiments of this invention, but are not intended to limit the scope of this invention. The scope protected by this invention is determined by the appended claims.

What is claimed is:

1. A display substrate, comprising a display area and a non-display area surrounding the display area, wherein the non-display area comprises:

a first signal line, an insulating layer, and a second signal line, which are located above a base substrate, wherein projections of the first signal line and the second signal line on the base substrate are intersected with each other, and the insulating layer allows the first signal line and the second signal line to be insulated from each other, a dummy electrode in the same layer as the second signal line, and a semiconductor pad provided between the dummy electrode and the insulating layer, wherein the projection of the dummy electrode on the base substrate and the projection of the first signal line on the base substrate are intersected with each other with an intersection being located within the projection of the semiconductor pad on the base substrate, and wherein the projection of the semiconductor pad on the base substrate and the intersection of the projections of the first signal line and the second signal line on the base substrate do not overlap.

2. The display substrate according to claim 1, wherein the semiconductor pad is formed from at least one material of silicon, germanium, a silicon-germanium alloy, a silicon-carbon alloy, a silicon-germanium-carbon alloy, a carbon-based semiconductor, a Group II-VI compound semiconductor material, a Group compound semiconductor material, an oxide semiconductor material, and an organic semiconductor material.

3. The display substrate according to claim 2, wherein the semiconductor pad is formed from at least one material of amorphous silicon, polycrystalline silicon, and monocrystalline silicon.

4. The display substrate according to claim 1, wherein the first signal line and a gate line are provided in the same layer and employ the same material, and the dummy electrode and source/drain electrodes are provided in the same layer and employ the same material.

5. The display substrate according to claim 1, wherein the first signal line and source/drain electrodes are provided in the same layer and employ the same material, and the dummy electrode and a gate line are provided in the same layer and employ the same material.

6. The display substrate according to claim 1, wherein the dummy electrode and the semiconductor layer are located on at least one side of the non-display area.

7. The display substrate according to claim 1, wherein the non-display area comprises at least two second signal lines provided in parallel, and the dummy electrode and the semiconductor pad are provided between two adjacent second signal lines provided in parallel.

8. A display apparatus comprising the display substrate according to claim 1.

9. A method for producing the display substrate comprising a display area and a non-display area surrounding the display area according to claim 1, comprising:

forming a pattern of the first signal line on the base substrate in the non-display area by a patterning process;

forming the insulating layer above the first signal line;

forming a pattern of the semiconductor pad above the insulating layer by a patterning process, wherein the projection of the first signal line on the base substrate and the projection of the semiconductor pad on the base substrate are intersected with each other;

forming a pattern of the second signal line above the insulating layer by a patterning process, wherein projections of the first signal line and the second signal line on the base substrate are intersected with each other;

forming a pattern of the dummy electrode above the insulating layer and the semiconductor pad by a patterning process, wherein the projection of the dummy electrode on the base substrate and the projection of the first signal line on the base substrate are intersected with each other with an intersection being located within the projection of the semiconductor pad on the base substrate.

10. The method according to claim 9, wherein the first signal line and a gate line are produced in the same layer, and the dummy electrode and source/drain electrodes are produced in the same layer.

11. The method according to claim 9, wherein the first signal line and source/drain electrodes are produced in the same layer, and the dummy electrode and a gate line are produced in the same layer.

12. The method according to claim 9, wherein the pattern of the second signal line and the pattern of the dummy electrode are formed by an identical patterning process.

\* \* \* \* \*